(12) United States Patent  
Chabrecek et al.

(10) Patent No.: US 9,313,884 B2  
(45) Date of Patent: Apr. 12, 2016

(54) ELECTRODE SUBSTRATE AND PLANAR OPTOELECTRONIC DEVICE

(75) Inventors: Peter Chabrecek, Freidorf (CH); Uriel Sonderegger, Winkeln (CH)

(73) Assignee: Sefar AG, Thal (CH)

( * ) Notice: Subject to any disclaimer, the term of this patent is extended or adjusted under 35 U.S.C. 154(b) by 0 days.

(21) Appl. No.: 14/110,534

(22) PCT Filed: Mar. 23, 2012

(86) PCT No.: PCT/EP2012/055175  
§ 371 (c)(1),  
(2), (4) Date: Jan. 21, 2014

(87) PCT Pub. No.: WO2012/136488  
PCT Pub. Date: Oct. 11, 2012

(65) Prior Publication Data  
US 2014/0191211 A1 Jul. 10, 2014

(30) Foreign Application Priority Data

Apr. 8, 2011 (DE) .......................... 10 2011 016 454  
May 10, 2011 (DE) .......................... 10 2011 050 250

(51) Int. Cl.  
*H05K 7/00* (2006.01)  
*H05K 1/02* (2006.01)  
(Continued)

(52) U.S. Cl.  
CPC ............ *H05K 1/0274* (2013.01); *D03D 1/0088* (2013.01); *H01L 31/0224* (2013.01);  
(Continued)

(58) Field of Classification Search  
CPC .. H01L 33/38; H01L 51/0096; H05K 1/0274; H05K 7/00

USPC .......................................................... 174/251  
See application file for complete search history.

(56) References Cited

U.S. PATENT DOCUMENTS

2009/0166877 A1  7/2009  Lifka et al.  
2010/0208445 A1  8/2010  Asvadi et al.  
(Continued)

FOREIGN PATENT DOCUMENTS

WO  2005067042  7/2005

OTHER PUBLICATIONS

International Search report dated Jun. 28, 2012.

*Primary Examiner* — Tran Tran  
(74) *Attorney, Agent, or Firm* — Bachman & LaPointe, PC

(57) ABSTRACT

Electrode substrate for an optoelectronic device having a fabric (10) that includes electrically conductive (14; 56) as well as non-conductive (12; 50) and transparent fibers wherein the fabric is furnished over a wide area with a transparent, electrically conductive coating (26, 28, 58) in such manner that projecting or exposed portions of the electrically conductive fibers cooperate with the conductive coating in order to produce electrical contacts, wherein the conductive coating has a layer thickness that is smaller than a mean diameter of the electrically conductive and electrically non-conductive fibers of the fabric, a fabric weave of the electrically conductive fibers of the fabric is organized in such a manner that in order to create the protruding portions, the fibers encompass at least 2 of the non-conductive fibers that extend transversely in the manner of a twill weave, the fabric is embedded in the coating in such manner that portions (20; 22; 56) of the conductive fibers protrude from a non-conducting polymer material of the coating and/or are exposed, at least on one side of the coating, and the coating is applied to a polymeric, electrically non-conductive and transparent carrier film that is situated opposite the conductive coating that is applied to one side relative to the fabric.

15 Claims, 3 Drawing Sheets

(51) Int. Cl.

| | | |
|---|---|---|
| D03D 1/00 | (2006.01) | |
| H01L 51/52 | (2006.01) | |
| H01L 51/44 | (2006.01) | |
| H01L 31/0224 | (2006.01) | |
| H01L 33/38 | (2010.01) | |
| H01L 51/56 | (2006.01) | |
| H05K 1/18 | (2006.01) | |
| H05K 1/03 | (2006.01) | |
| H05K 1/09 | (2006.01) | |
| H01L 51/00 | (2006.01) | |

(52) U.S. Cl.
CPC ............ *H01L33/38* (2013.01); *H01L 51/0096* (2013.01); *H01L 51/442* (2013.01); *H01L 51/5203* (2013.01); *H01L 51/56* (2013.01); *H05K 1/038* (2013.01); *H05K 1/095* (2013.01); *H05K 1/189* (2013.01); *D10B 2401/16* (2013.01); *H01L 51/0037* (2013.01); *H01L 51/0097* (2013.01); *H01L 2924/0002* (2013.01); *H05K 2201/0108* (2013.01); *H05K 2201/029* (2013.01); *H05K 2201/0257* (2013.01); *H05K 2201/0281* (2013.01); *H05K 2201/10106* (2013.01); *Y02E 10/549* (2013.01); *Y02P 70/521* (2015.11); *Y10T 29/49155* (2015.01)

(56) References Cited

U.S. PATENT DOCUMENTS

2011/0122591 A1* 5/2011 Hucker .................. B29C 70/22 361/760
2011/0247689 A1 10/2011 Chabrecek et al.

* cited by examiner

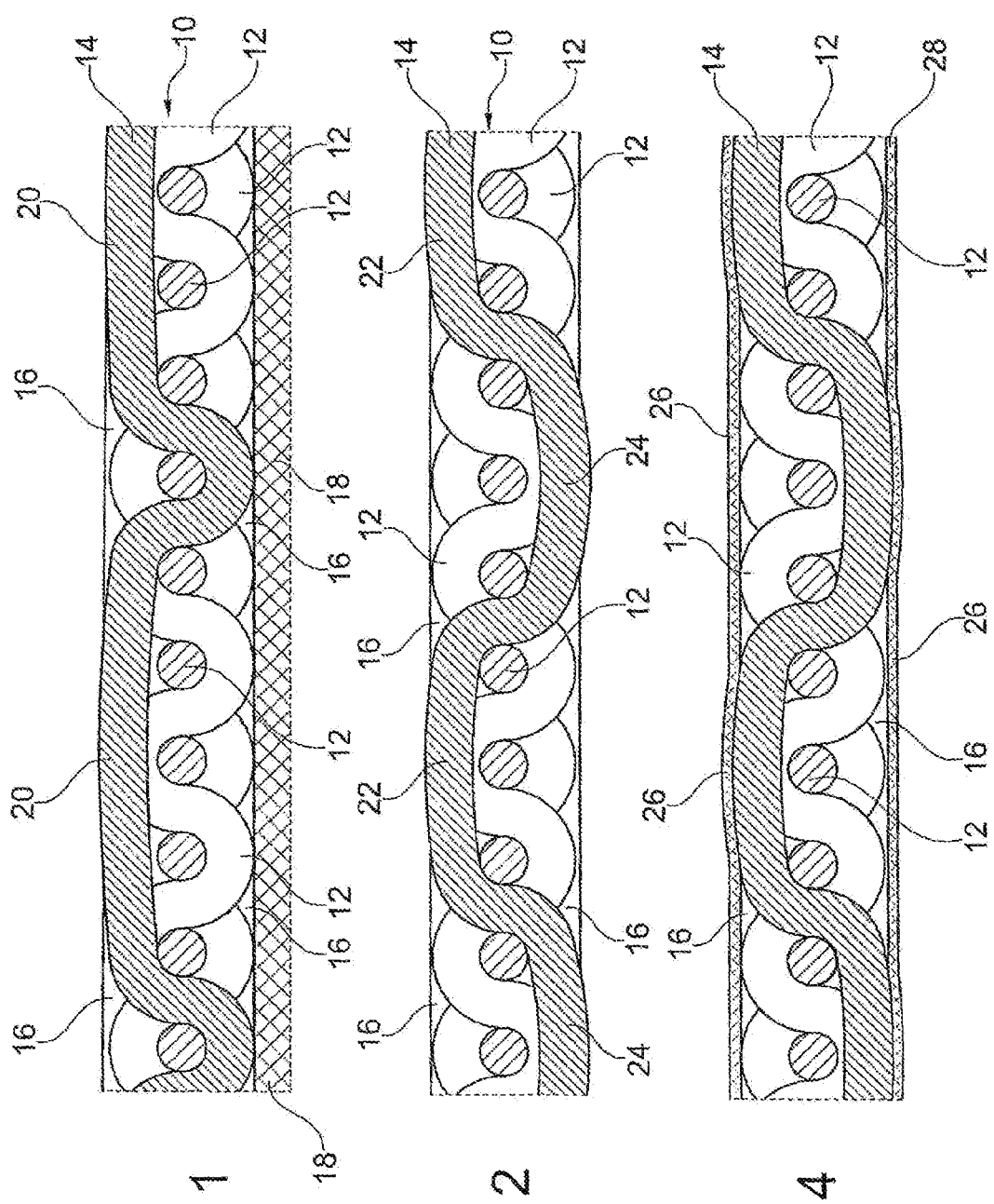

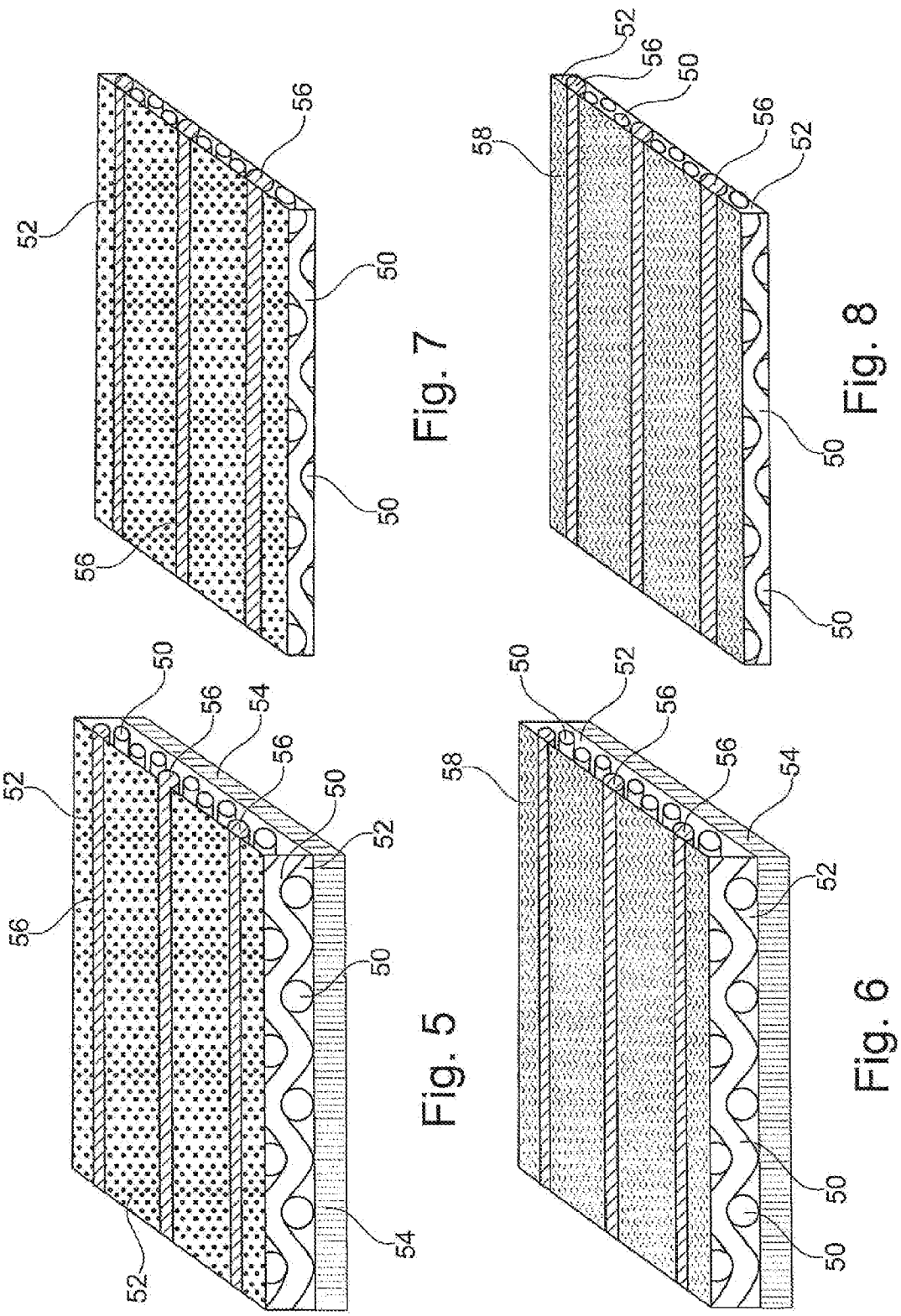

ELECTRODE SUBSTRATE AND PLANAR OPTOELECTRONIC DEVICE

BACKGROUND OF THE INVENTION

The present invention relates to an electrode substrate as is known from DE 20 2009 005 751 U1. The present invention also relates to a flat optoelectronic device, particularly an organic optoelectronic device in which such a flat electrode substrate is used, and a method for manufacturing an electrode substrate.

An electrode substrate known from the prior art is known from WO 2010/051976 A1, which is held by the applicant. In that document, it was disclosed for the first time that, for optoelectronic devices such as solar cells, light-emitting devices or the like, transparent electrode surfaces such as were implemented in traditionally known manner using electrically conductive oxide layers (TCO=transparent conductive oxides) could advantageously be replaced with easily manufacturable fabric surfaces having reproducible properties and favourable electrical conductivity. In particular, the prior art to which reference was made as representative of the species enabled the flexible capability of implementing the electrical conductivity properties desired for each individual case using a fabric of electrically conductive and non-conductive fibres, and the capability of avoiding undesirable, resistance-related voltage drops such as occurred for example in large area TCO elements (when ITO is used, for example), and at the same time of using the flexible properties of a fabric additionally and advantageously, although opportunities for use were traditionally limited by the typically brittle TCO material.

However, it was found during further developments of fabric-based electrode substrates for optoelectronic devices that a substructure known precisely from WO 2010/051976 has a comparatively high surface roughness due to the combination of fabric and the polymer coating that (partially) soaks the fabric while not itself being conductive, which surface roughness has proven to be unfavourable for such organic optoelectronic devices (such as organic solar cells); thus for example (surface roughness induced) inhomogeneities have an unfavourable effect on the optoelectronic properties desired in a given case.

SUMMARY OF THE INVENTION

With regard to the further prior art, reference is made to US 2009/166877 A1, which discloses the production of electrodes from woven conductive fibres and the application thereto of conductive structures.

In view of the above, the object of the present invention is a species-defining device in the form of a fabric substrate for an optoelectronic device for the purpose of improving the suitability thereof for organic optoelectronic applications, and thereby particularly reducing (electrically and/or mechanically effective) surface roughness and thus creating the basis for greater uniformity and homogeneity of a conductor layer obtained by using such a substrate as an electrode. Moreover, a method for manufacturing such a fabric substrate for an optoelectronic device is also suggested.

This object is solved by the electrode substrate, the flat optoelectronic device and the method for manufacturing an electrode substrate as disclosed herein; advantageous refinements of the invention are also described herein.

Advantageously according to the invention, and diverging from the teaching of WO 2010/051976, the effect of the fabric, or more precisely of the electrically conductive fibres provided in the fabric, is to enable for example transparent and conductive oxide layers to be dispensed with completely on the surface, together with a conductive coating which nevertheless, and to this extent developing the basic idea of WO 2010/051976, is able to cooperate in electrically conductive manner with flat sections of the electrically conductive fibres that are exposed and/or bare and protrude out of the polymer coating in electrically conductive manner.

In this context, the present invention advantageously ensures according to the invention that, again by appropriate selection and configuration of the non-conductive fibres (also in the fabric structure and the fabric weave, relative to the non-conducting fibres), the desired mechanical properties for the respective application (e.g., flexibility) may be adjusted and combined with the desired electrical properties (for example surface resistance and conductivity properties) and the desired optical properties (for example transmissivity for light, as determined by the open area between the fabric and a respective fabric density the transparency of the fibres and the light scattering property of the fibre surface).

Advantageously according to the invention, such a structure is now combined with an electrically contacting and superposed conductive coating that, since it is in electrical contact with the plurality of prominent (protruding from the coating) sections of the conductive fibres, enables planar interlayer connection, wherein the underlying, electrically conductive fabric advantageously lowers for example the electrical surface resistance of a pure TCO (or alternatively conductive polymer) layer and thus results in a favourable outcome, that particularly smooth surfaces having very low roughness values are obtainable through the applied conductive coating, and which in turn are very well suited for constructing (or creating) organic optoelectronic components or subassemblies, and also that the underlying fabric structure, which is perfused with a metallic substance and therefore has good conducting capabilities, ensures in contacting manner that even large areas (on or along the conductive coating) do not exhibit any significant voltage drop if the mechanical, electrical/electronic and optical properties are optimally harmonized with each other.

Thus, with the present invention it also advantageously necessary to apply only a very thin conductive coating (since the electrical conductivity and/or possible voltage drops along the actual conductive coating material are no longer of critical importance), with the positive consequence that there is only a need to use a very small quantity of (relatively expensive) material for the conductive coating, such as with the use of transparent, electrically conductive polymers, TCO, carbon nanotubes or metal nanoparticles.

Thus for the first time, the present invention provides the capability to combine the advantageous conductivity, flexibility, and optical properties of fabric-based electrodes with the particularly advantageous (because very smooth) surface properties of otherwise known electrically conductive polymer and/or TCO layers, so that precisely for the increasingly important field of organic optoelectronic devices favourable manufacturing conditions are created the production of the electrodes used therein.

For the purposes of the present invention it is preferred to fix the thickness of the conductive coating such that the maximum thickness thereof (relative to the dried and cured state of the respective applied coatings) does not exceed a maximum corresponding to one tenth ($1/10$) of the diameter of the electrically conductive and electrically non-conductive fibres, but in practice the conductive coating to be applied is substantially thinner, and in preferred embodiments is equal to less than $1/10$ of the average or mean fibre diameter, more preferably less than 1/100 or even less than 1/200 of said fibre diameter, and thus demonstrates convincingly that although the present invention does use the transparent, conductive material for the conductive coating, this layer is kept thin as possible (with additional beneficial effects that a typically brittle oxide layer offers for example using ITO as the TCO), and as the layer thickness becomes smaller becomes increasingly flexible and less brittle, and is thus significantly less prone to breaking even under mechanical stress.

Given that the electrically conductive fibres in preferred implementations of the invention typically have a diameter in the range from approximately 20 µm to 200 pm, preferably between 30 µm and 80 µm (60 µm being a useful value for the fibre diameter of a conductive fibre in practice) this means that a layer thickness of the conductive coating (when dry) is usually less than 2 µm, wherein typical dry film thicknesses of a TCO applied as a conductive layer or a conductive polymer layer (for example, PEDOT: PSS) are in the range from 0.01 µm to 10 µm, a preferred range in this context being between 0.02 µm and 1 µm.

A resulting surface resistance of the electrode is then determined by the various conductivities of the conductive fibres, a density of said conductive fibres in the fabric, and also an effective arrangement of the portions of the conductive fibres that protrude from the coating (or are exposed), and ultimately by the material used for the electrically conductive fibres, and then additionally by the material and a layer thickness of the conductive coating. In this context, the electrically conductive fibres are typically selected such that they have electrical resistance properties in the range from 1 Ω/m to 1000 Ω/m, preferably from 1 Ω/m to 10 Ω/m, wherein an AgCu fibre in the form of a wire with a thickness of 60 µm has a resistance of 6 Ω/m/.

Materials that may be used for the electrically conductive fibres in this context include both pure metals (such as Ag, Cu, Mo, W, Al, Au, HTW, XHTW, SS or the like) and metal alloys (AgCu, CuSn6, CuNi, CuNiMn, CuZn, AlMg5, and so forth), also metal-plated wires (CCA HTCCA, brass/Ag, Cu/Ag, Cu/Ni, and the like), or metallised polymer fibres such as silver-plated nylon yarns, or for example polymer fabrics metallised with AgCu or CuSn5.

The electrically non-conductive fibres that are integral to the invention, again with a fibre thickness preferably in the range from 20 µm to 200 µm, more preferably with a fibre thickness in the range from 30 µm to 70 µm, preferably comprise PEN, PBT, PA, glass, PTFE, PI, PE, PP, or comparable polymers or substances as mono-or multifilaments, one particularly favourable material being a transparent PET as a monofilament.

In a preferred variation of the present invention, the electrically non-conductive and the electrically conductive fibres are woven to create a fabric which has an unoccupied area (that is to say a portion of the surface that in the projection is not occupied by fibres) in the range between 10% and 90%, wherein the fabric is preferably configured such that it has an unoccupied area in the range between 40% and 80%.

In particular, with the present invention it is possible to make modifications to the nature of the fabric (for example the fabric weave) and thus determine particularly effectively the respective desired properties by determining the orientation of the electrically conductive fibres relative to the electrically non-conductive fibres. Thus, it is advantageous within the scope of preferred refinements of the invention to arrange the electrically conductive fibres of the fabric in only one or both directions of the fabric (the warp or the weft), the weft direction being preferred in this case.

In the practical realisation of the invention with typical wire diameters of the electrically conductive fibres in the range from 30 µm to 80 µm, a distance in the range from 0.2 mm to 200 mm between adjacent, parallel electrically conductive fibres in the fabric has proven to be favourable, a distance in the range from 0.5 mm to 2 mm being further preferred. Depending on the configuration of the fabric, the result of this is that a number between 2 and 600 adjacent non-conductive fibres then extend between respectively adjacent conductive fibres.

It also falls within the scope of the invention to configure the weave of the fabric in such a way that the portions projecting from the coating (in this respect the cross-sectional vertices of the conductive fibres) are as large as possible and/or have most favourable contact properties possible for the cooperating conductive coating. Consequently, although in principle the invention provides for coverage of all basic weave types (such as plain weave, satin weave and twill weave), it is preferred to provide the non-conductive fibres in the form of a classic 1/1 plain weave and/or to arrange the conductive fibres in a twill weave. According to the invention, the electrically conductive fibres then encompass a plurality of non-conductive fibres extending orthogonally or transversely thereto, in which case, as here, between 2 and 5 transversely running fibres are encompassed for example in typical and suitable 5/1, 4/2, 3/3 twill weaves.

A variant of the invention, which however may also be combined with the previously described embodiments of the invention, provides that at least some of the electrically-conductive fibres run straight (for example, in a simply woven 1/1 plain weave) and are thus incorporated in the fabric in such way (and to this extent do not follow a wave or arc form in cross-section) that they are stretched lengthwise and extend horizontally along the surface of the fabric (and in this respect then also along the substrate surface), so that the portion which according to the invention protrudes from the coating or is exposed is a portion of the fibre, which forms a flat (for example strip-like) surface section by material removal. Such a fibre, elongated and protruding by a portion, thus offers the obvious advantage of a large transition surface with the capability of creating a contact with a superposed conductive layer, wherein this variant of the invention additionally and according to refinements thereof advantageously provides for removal of such a protruding fibre section by grinding or polishing, preferably to a surface level even with the adjacent, transparent non-conductive coating, and thus creates the possibility of creating a completely flat surface, through which only exposed and conductive strips pass (again preferably extending parallel and evenly spaced), which are the exposed and levelled, extended portions of the electrically conductive fibres. Although it is preferred for this variation of the invention to apply a conductive layer (thin in this case as well in accordance with the invention described previously) to the surface that has been prepared as described and is preferably continuously flat (on one or both sides relative to the fabric), it is nevertheless also conceivable to provide only one correspondingly prepared fabric, in the manner of a semifinished or intermediate product, which is claimed as an integral part of the invention even without the application of the conductive layer protection.

For the purposes of the invention, the coating is an essentially non-conductive polymer that impregnates the fabric, which enables the prominence of portions of the conductive fibres and is created using a transparent polymer material that comprises an epoxy resin or epoxy varnish for example, also suitable (transparent in all cases) UV curing varnishes, solvent-based paints, water-based paints, emulsions, polyimides "hot melt" or the like.

As part of the invention, which lends itself particularly well to forming the electrode, only one flat side of which has the conductive coating, the coating is applied in the manner of an indirect coating by means of a provided polymer film (and again, typically transparent), in such manner that the polymer coating material is deposited on said film, and wet lamination is carried out thereafter by joining said film furnished with the coating material and the fabric, and then the film is either left on the arrangement (which may be particularly advantageous for OLEDs or OSCs with regard to stability, barrier properties and the like), or the film is then removed. Other options for introducing the coating onto or into the fabric are possible in the context of alternative variants of the invention, such as by direct coating, lamination or the like. For this carrier film, which also preferably has a typical thickness in the range between 20 µm and 200 µm (more preferably between 50 µm and 100 µm), various transparent materials are suitable, such as PET, PEN, PBT, PI, PA12, PA11, PA6, PA6.6, PTFE, PE, PP or the like, PEN and PET being preferred as the film material.

The result produced by the present invention provides a highly flexible yet mechanically, electrotechnically and optically powerful substrate system that combines the advantages of traditional conductive oxide layers (TCO created using ITO, FTO, AZO, ATO or the like) in addition or as an alternative to traditional transparent and electrically conductive polymers (such as PEDOT:PSS, carbon nanotubes or metal nanoparticles) in combination with the favourable manufacturing, flexibility and electrical conductivity properties of fabrics furnished with conductive fibres, and thus arrive at a combination that offers ideal surface properties (particularly low roughness values) for example for creating organic optoelectronic components, and at the same time still provides for a minimal quantity (cost of materials) for the top conductive layers for producing the conductive coating since it is possible to apply the coating very thinly. At the same time, the present invention as described is particularly suitable for the production of optoelectronic organic devices such as flat, flexible, thin-film solar cells (OSC, DSC, µc-Si:H, a-Si:H or other) or also flexible tandem cells, but is not limited to these applications, but instead the present invention also lends itself to the production of other electrodes in which good, homogeneous electrical and mechanical properties must be combined with flexibility, low roughness and high transparency.

BRIEF DESCRIPTION OF THE DRAWINGS

Further advantages, features and particularities of the invention will be evident from the following description of preferred embodiments thereof and with reference to the drawing. In the drawing:

FIG. 1 is a schematic cross-sectional view through the structure of an electrode substrate for an organic optoelectronic device according to a first preferred embodiment of the invention (shown without the conductive layer, however);

FIG. 2 shows a variant of the configuration of FIG. 1 as a second embodiment, and intermediate stage for creating an electrode substrate with an alternate fabric weave as 3/3 twill weave;

FIG. 4 is a cross-sectional view through an arrangement according to FIG. 2, FIG. 3 for creating a tandem substrate, not included in the scope of the invention, that has a conductive coating on both sides;

FIG. 5, FIG. 6 show two perspective views of an embodiment for creating a variant of the invention according to which electrically conductive fibres extending parallel to each other in one direction stretch along the substrate surface and are abraded (FIG. 5), in particular by grinding and/or polishing, to produce a consistently flat, levelled substrate surface, wherein then, FIG. 6, a thin conductive layer is applied to this flat surface, and FIG. 7, FIG. 8 show a further embodiment of the variant according to FIG. 5, FIG. 6, according to which the levelled surface furnished with continuous, exposed portions of the conductive fibres is created by removing material from the coated substrate on both sides (FIG. 7), with additional conductive coating (FIG. 8).

DETAILED DESCRIPTION

Figure 3:
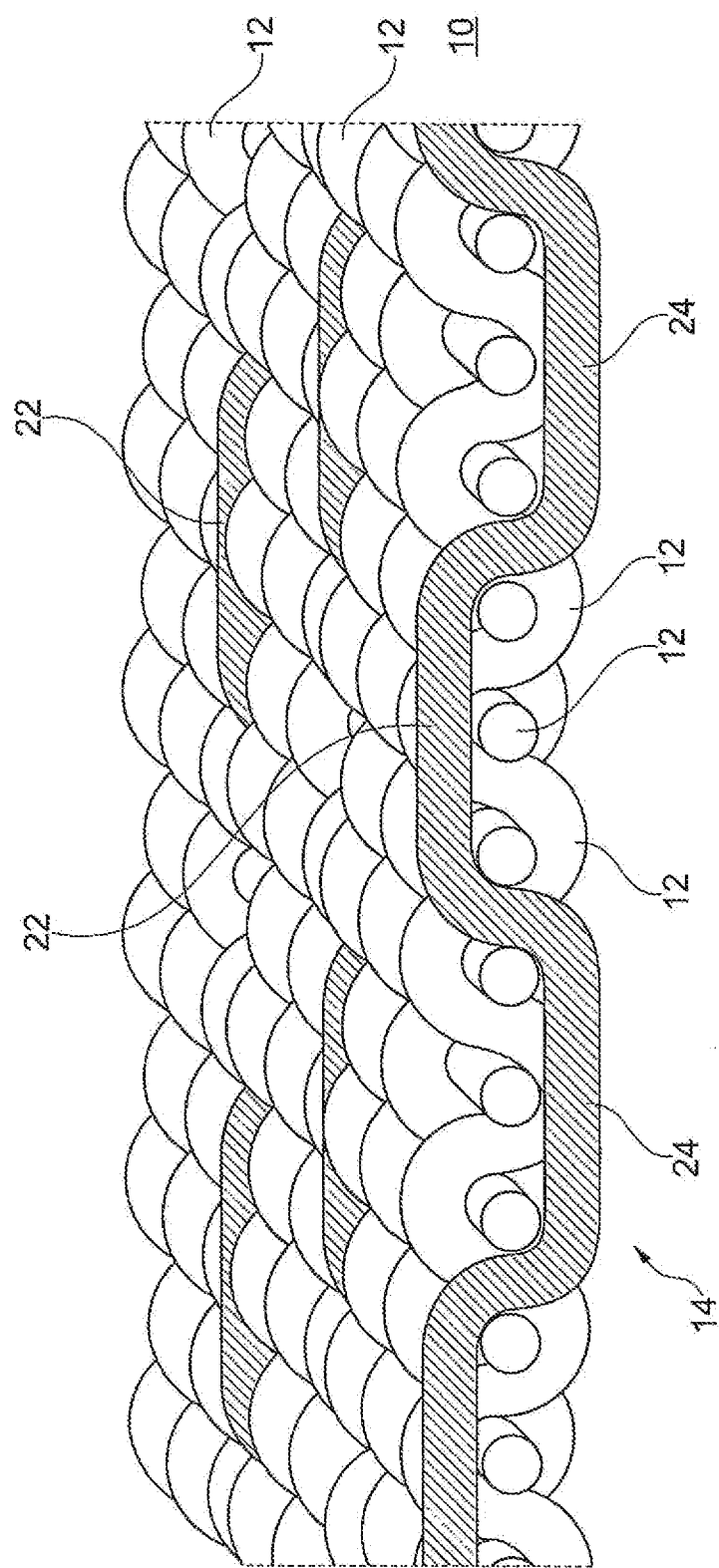
FIG. 3 is a three-dimensional view of the fabric and coating arrangement of FIG. 2.

FIG. 1 shows a schematic cross-sectional view through the structure of an electrode substrate for an organic solar cell according to a first preferred embodiment. A fabric 10 shown in cross-section in FIG. 1 is made from PET filaments 12 having a thickness of 60 µm (more precisely: transparent PET filaments) with which metal fibres 14 (wires) composed of a CuAg alloy and having thickness of 60 µm are woven in the manner of a 5/1 twill weave, wherein metal wires 14 are each arranged parallel to and at a distance of 1 mm from each other, and extend only in the weft direction and, as shown in the cross-sectional view of FIG. 1, enclose five non-conductive fibres 12 extending transversely thereto, corresponding to a 5/1 twill weave.

This fabric structure is coated (filled or impregnated) with a resin layer (coating) 16 that comprises an ultraviolet-curing epoxy resin, and in the embodiment shown has been applied in the form of an indirect coating via transparent PET film 18 having a thickness of 50 µm. More precisely, the fabric structured in the manner described above was brought into contact with film 18, to which the resin material for coating 16 had been applied in a liquid or paste-like state. As a result of joining, the impregnation then followed in such manner that after the resin material cured coating 16 almost completely enclosed fabric 12, 14, and only top portions 20 of wires 14 protrude from the resin material of coating 16 and are contactable there.

In the finished embodiment of FIG. 1, if film 18 were left in the position shown (thus providing additional mechanical stabilisation or barrier effect), a thin layer of transparent, electrically conductive polymer would also be applied to coating 16 and the exposed metallic portions 20 of wires 14 in such manner that said additional conductive layer (not shown in FIG. 1) has a thickness of about 200 nm. Suitable material for such a conductive layer is for example PEDOT:PSS, which is available for example from Agfa with the name "HWS 5", or from Heraeus with the name "Clevios P VP CH 8000"; this material would be applied in a conventional coating method such as reverse roll, curtain coating, slot die, by screen printing or similar, wherein both continuous application methods (such as roll-to-roll), and discontinuous methods (screen printing or spin-coating) may be employed.

The electrode thus prepared may then serve as the basis for the active and other layers of an organic solar cell (not shown) to be provided thereon.

FIGS. 2 to 3 illustrate a second embodiment of the present invention. The reference signs used in these figures correspond to those of the first embodiment in FIG. 1 and are used for identical or equivalent functional elements: Again, a CuAg wire 14 having a thickness of 60 µm, extends in the weft direction, but in this case in the pattern of a 3/3 twill weave, wherein non-conductive fibres 12, as in the first embodiment, are transparent PET yarns with a thickness of 20 to 60 µm. Here too, coating 16 impregnates the fabric thus formed, but in this case, unlike the first embodiment of FIG. 1, in such a way that electrical contactability is provided in the form of exposed portions 20 of wires 14 not only on one flat side, but in the embodiment of FIGS. 2 to 4 on both sides, in the form of the uppermost portions 22, 24 in each case.

Accordingly, this makes it possible to apply an electrically conductive, transparent polymer layer (PEDOT:PSS, as in the first embodiment in FIG. 1), as the conductive layer, that is to say for contacting portions 22 and 24, to both sides. This layer 26 shown in FIG. 4 (with regard to portions 22) and 28 (with regard to portions 24) thus enable an electrode configuration that combines the advantageous electrical, optical and mechanical properties of connecting the fabric to outer conductive layers on both sides, and still offers optimised surface roughness (as in the first embodiment as well) for the purpose creating an effective outer surface of the respective layers 26, 28 for constructing the other layers for a particular optoelectronic product, such as "tandem cells".

FIG. 3 shows in perspective view and referring to FIG. 2 how the individual fabric fibres run relative to each other in the second embodiment; it is clearly shown that wire 14 only extends in the weft direction and forms the 3/3 twill weave and is offset with respect to the alignment of adjacent, parallel wires.

In the following, a variant of the invention will be described with reference to FIGS. 5 to 8, in which the inventive idea of the conductive fibre portions protruding from the coating is developed further in the form of strip-like conductive portions that extend essentially along the entire length of at least one dimension of the fabric on or in the surface thereof, and thus further improve the contact of the metal fabric, for a superposed conductive coating, for example.

Thus, FIG. 5 shows an embodiment of this variant of the invention, in which a simple fabric with 1/1 plain weave 50 consisting of non-conductive fibres, more precisely a fabric of PEN yarn (fibre diameter 35 µm, transparent) is coated with a transparent UV-curing varnish 52 corresponding to the previously described examples. This coating is provided on one side with a PET film 54 having a thickness of 75 µm, which again corresponds to some of the embodiments described above.

According to the present variant of FIG. 5, however, now multiple elongated conductive fibres 56 (made of molybdenum wire, diameter 40 µm) extend parallel to each other along the fabric, and the substrate surface facing film 54, such that after the substrate surface has been ground the levelled, consistently flat surface structure shown in FIG. 5 is created, in fact a plurality of parallel, strip-like conductor portions that each form flat surfaces and are formed by removing material from fibres 56, each delimited on both sides by surface portions of varnish coating 52.

If conductive fibre 56 and is incorporated in fabric 50 (or woven in the pattern shown) in such manner that it extends horizontally and absolutely straight (that is to say without undulations, sinewaves or cross-sectional curvature), after coating and subsequent grinding, and preferably additional polishing, a continuous conductive path is created across the entire film surface. In this context, the width of said path ("BUS BAR") depends on the diameter of the conductive fibres and the depth to which material was removed in the grinding process, so that a maximum strip width up to the diameter of the fibres is achievable.

In practice, material would be removed from one side of the composite shown in FIG. 5 (alternatively, two-sided removal may take place as shown in FIG. 7), wherein suitable trimming, grinding and polishing machines are used to create an extremely smooth surface. By cutting or rolling, sanding and other grinding methods and with appropriate setting of the abrasive (as well as other parameters, such as a rotating speed and rotating direction of rollers or grinding belts), in this way it is possible to obtain a very smooth surface; typical results based on the schematic representations according to FIGS. 5 to 8 use grinding discs with a grain size between 1000 and 1200, or diamond polishing in the region between 1 µm and 3 µm. In addition, the substrate is cleaned at suitable intervals.

This approach for material removal in particular (first, fibre material 50 that is crossed by the conductive fibres is removed. Then, non-conductive fibres with adjacent [cured] paint material of coating 52 as well as parts of the conductive fibres are removed) makes it possible to produce an extremely flat, smooth and thus contact-promoting surface, depending on how this process step is organized; as shown in the progression in FIG. 6, it serves to optimise the approach and contacting of a conductive coating 58, in the embodiment formed by PEDOT:PSS with a layer thickness of 200 nm (in the cured and dried state).

In the specific variation and using the parameters and materials as described above, it is thus possible to achieve surface roughnesses in the nanometer range (typically as small as <500 nm), so that the ground and polished surface shown in FIG. 5 (and in the progression in 7) has the same surface quality as plastic or metal foil. Thus, the risk of short circuits is then significantly reduced, particularly in practical uses for optoelectronic applications with very thin conductive layers, which in turn means that it is particularly well suited for the preferred applications as OLED, OPV, thin-film solar cells or the like, though the present invention is not limited to these application examples.

The greater contact area of the exposed strip shape compared with the embodiments of the invention described in the preceding is also evident, in FIG. 5 for example.

Not least, these further improved surface properties also generally render further processing steps simpler, such as subsequent laminating, coating with other coatings or the like, as well as a general uniformity in a multi-layer structure that is built this way.

The present invention is not limited to the embodiments shown, rather the object of the invention can be used to good effect in any application in which transparent, flat electrodes are to be used, and on which the effective surfaces are to be smoothed (namely cooperate with transparent conducting surfaces) without allowing the particular properties of these conductive surfaces, such a brittleness, to negatively affect the flexible and optical properties of the device.

The invention claimed is:
1. Electrode substrate for an optoelectronic device having
   a fabric that comprises electrically conductive as well as non-conductive and transparent fibres
   and a coating made from a transparent, electrically non-conductive polymer material,
   wherein the coating is furnished over a wide area with a transparent, electrically conductive coating in such manner that projecting or exposed portions cooperate with the conductive coating in order to produce electrical contacts wherein the conductive coating has a layer thickness that is smaller than a mean diameter of the electrically conductive and electrically non-conductive fibres of the fabric, a fabric weave of the electrically conductive fibres of the fabric is organized in such a manner that in order to create the projecting or exposed portions the fibres encompass at least 2 of the non-conductive fibres that extend transversely in the manner of a twill weave, wherein the fabric is embedded in the coating in such manner that portions of the conductive fibres protrude from the non-conducting polymer material of the coating or are exposed or protrude and are exposed, at least on one side of the coating, and the coating is applied to a polymeric, electrically non-conductive and transparent carrier film that is situated opposite the conductive coating that is applied to one side relative to the fabric.

2. The substrate according to claim 1, wherein a ratio of layer thickness of the conductive coating relative to diameter of the fibres is less than 1:10.

3. The substrate according to claim 1, wherein the electrically conductive fibres or the electrically non-conductive fibres or both the electrically conductive fibres and the electrically non-conductive fibres have a diameter in the range between 10 μm and 200 μm.

4. The substrate according to claim 1, wherein the conductive coating comprises at least one of a transparent polymer, a transparent oxide, carbon nanotubes, and metal nanoparticles.

5. The substrate according to claim 1, wherein the electrically conductive fibres in the fabric extend parallel with each other in such manner that from 1 to 600 the non-conductive fibres extend between two adjacent electrically conductive fibres, and/or a distance between two adjacent electrically conductive fibres is between 0.2 mm and 200 mm.

6. A planar optoelectronic device in which at least one flat electrode is created by the electrode substrate according to claim 1.

7. An optoelectronic application selected from the group consisting of OLED, OPV, displays and touch screens, and comprising the substrate according to claim 1.

8. The substrate according to claim 1, wherein the projecting or exposed portions of the electrically conductive fibres engage or protrude into the conductive coating or engage and protrude into the conductive coating.

9. The substrate according to claim 1, wherein the electrically conductive fibres encompass between 3 and 6 of the non-conductive fibres that extend transversely.

10. The substrate according to claim 2, wherein the ratio is less than 1:100.

11. The substrate according to claim 3, wherein the electrically conductive fibres or the electrically nonconductive fibres or both the electrically conductive fibres and the electrically non-conductive fibres have a diameter in the range between 20 μm and 80 μm.

12. The substrate according to claim 4, wherein the conductive coating comprises silver nanoparticles.

13. The substrate according to claim 5, wherein the electrically conductive fibres in the fabric extend parallel with each other in such manner that from 2 to 10 non-conductive fibres extend between two adjacent electrically conductive fibres, and/or a distance between two adjacent electrically conductive fibres is between 0.5 mm and 2.0 mm.

14. The substrate according to claim 1, wherein the conductive coating is applied to the coating in multiple layers.

15. The substrate according to claim 1, wherein the projecting or exposed portions of the electrically conductive fibres form a planar contact surface for the conductive coating.

* * * * *